United States Patent [19]

Matsumoto et al.

[11] Patent Number: 5,500,386

[45] Date of Patent: Mar. 19, 1996

[54] MANUFACTURING METHOD OF SEMICONDUCTOR DEVICES

[75] Inventors: Shoji Matsumoto, Kyoto; Hideo Nikou, Shiga; Satoshi Nakagawa, Kyoto, all of Japan

[73] Assignee: Matsushita Electronics Corporation, Osaka, Japan

[21] Appl. No.: 478,340

[22] Filed: Jun. 7, 1995

Related U.S. Application Data

[62] Division of Ser. No. 364,115, Dec. 27, 1994.

[30] Foreign Application Priority Data

Dec. 28, 1993 [JP] Japan .................... 5-336161
Feb. 28, 1994 [JP] Japan .................... 6-029580

[51] Int. Cl.⁶ .................................... H01L 21/70
[52] U.S. Cl. .................... 437/60; 437/201; 437/245; 437/246; 437/919; 216/6; 216/62; 216/72; 216/75; 156/652.1; 156/656.1; 148/DIG. 14
[58] Field of Search .................... 216/6, 62, 72, 216/75; 156/652.1, 656.1; 437/47, 60, 187, 201, 245, 246, 919; 148/DIG. 14

[56] References Cited

U.S. PATENT DOCUMENTS

| | | | |
|---|---|---|---|
| 3,923,568 | 12/1975 | Bersin | 216/75 |
| 5,122,477 | 6/1992 | Wolters et al. | 437/60 |
| 5,439,840 | 8/1995 | Jones, Jr. et al. | 437/60 |
| 5,440,173 | 8/1995 | Evans, Jr. et al. | 437/246 |

*Primary Examiner*—Brian E. Hearn
*Assistant Examiner*—Trung Dang
*Attorney, Agent, or Firm*—Willian Brinks Hofer Gilson & Lione

[57] ABSTRACT

A method of manufacturing a semiconductor device, where on top of a substrate having already-completed circuit elements and wiring, etc., an insulation underlayer a, Pt layer for a bottom electrode, a dielectric film and a Pt layer for a top electrode are shaped.

A top electrode, capacitance insulation film and bottom electrode are formed by etching the Pt layer for the top electrode or the Pt layer for the bottom electrode using an etching gas contained an S component while composing a Pt and S compound. Alternatively the Pt and S compound can be composed first, and then the compound can be etched.

1 Claim, 8 Drawing Sheets

MANUFACTURING METHOD OF SEMICONDUCTOR DEVICES

This is a divisional of application Ser. No. 08/364,115, filed Dec. 27, 1994.

FIELD OF THE INVENTION

This invention relates to a manufacturing method for semiconductor integrated circuits having a built-in capacitor in which ferroelectric material is used as capacitance insulation film. Specifically, this invention relates to a fine pattern dry etching process to be applied to the Pt electrodes of said capacitor.

BACKGROUND OF THE INVENTION

In the midst of general trends towards finer structuring of semiconductor devices, development activities have been remarkable in the field of microcomputers having capacitors of high dielectric constant materials which is effective to reduce unnecessary radiation, or electro-magnetic interference, and in the field of non-volatile RAM having built-in ferroelectric capacitors which facilitates low-voltage operation and high read/write speed. The ferroelectric materials are made mainly of metal oxide, and contain substantial amounts of very reactive oxygen. In forming a capacitor with such dielectric film, material for its electrodes must be least reactive; precious metals such as Pt, palladium, etc. must be used.

Figure 9:
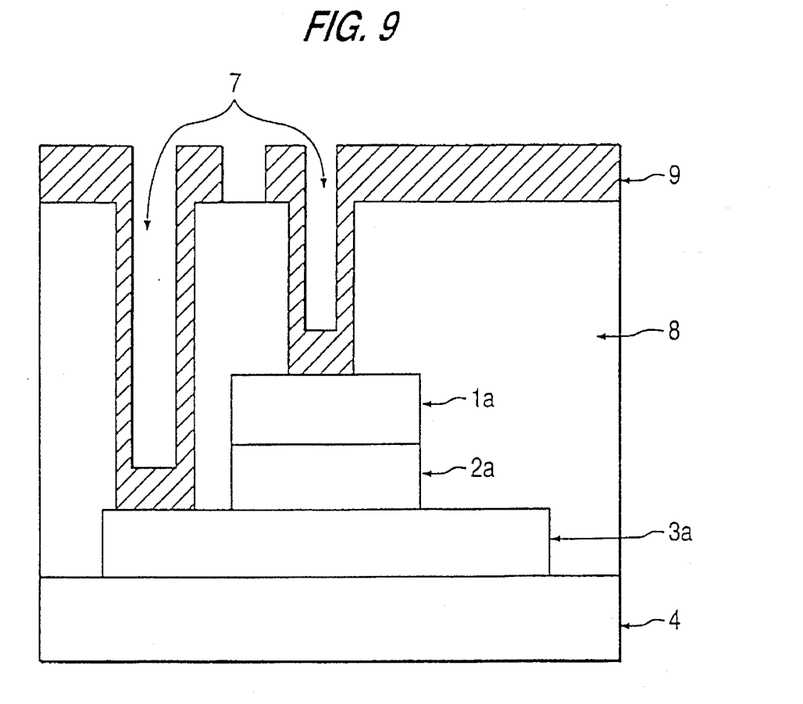
FIG. 9 shows a cross-section of typical capacitor manufactured by conventional semiconductor device manufacturing method.

FIG. 9 shows a typical structure of a capacitor in a semiconductor device having a built-in dielectric capacitor. In FIG. 9, 1a denotes a top electrode, 2a a capacitance insulation film, 3a a bottom electrode, 4 an underlayer, 7 a contact hole, 8 an inner insulation layer (oxide layer) and 9 wiring.

In the above mentioned structure, the bottom electrode 3a is made larger than the top electrode 1a, in order to provide contact individually at two points, viz. top electrode 1a and bottom electrode 3a, with the upper wiring 9.

The etching process to form the capacitor consists of two processes. One is etching of a Pt top electrode layer and dielectric film, and the other is etching of a Pt bottom electrode layer 3; wherein, etching on the Pt top electrode layer and dielectric film must be conducted at a speed different from that on the Pt bottom electrode.

In the prior art, Pt etching has been conducted by means of wet etch with aqua regia, ion milling with Ar gas, or by other means. However, the nature of both wet etching and ion milling is isotropic etching, which means the grade of precision is not high enough for the fine pattern processing. Especially, ion milling bears with it a drawback that there is not much difference in etching speed between Pt and underlayer material.

In order to overcome the above mentioned drawback, active research and development efforts have been made in Pt fine pattern processing by means of dry etching; where, as etching gas, use of $Cl_2$ and HBr are reported (Extended Abstracts, Autumn Meeting 1991. The Japan Society of Applied Physics, 9p-ZF-17, p. 516; Extended Abstracts, Spring Meeting 1993, The Japan Society of Applied Physics, 30a-ZE-3, p577, and others). What follows is an explanation of the dependance of Pt etching speed to high frequency (RF) electric power when $Cl_2$ gas is used as etching gas.

Figure 10:
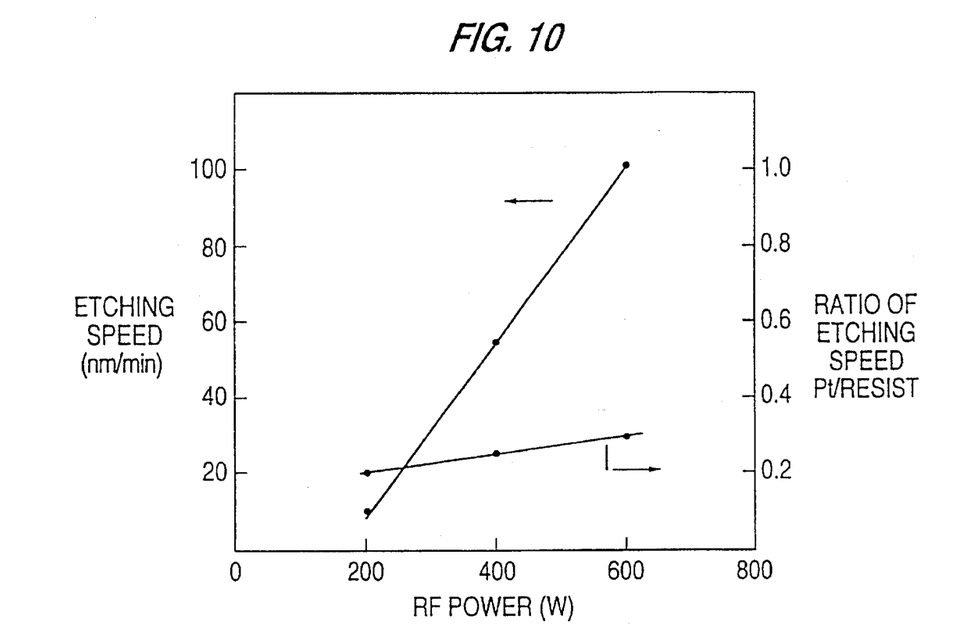
FIG. 10 is a characteristics chart that shows the dependence of Pt etching speed and Pt/resist etching speed ratio to RF power in the above manufacturing method, where, single substance $Cl_2$ gas was used as etching gas.

FIG. 10 shows the dependence of Pt etching speed, and of Pt/resist etching speed ratio to RF power, with $Cl_2$ gas as etching gas. The horizontal axis denotes RF power, the left vertical axis Pt etching speed, and the right vertical axis Pt/resist etching speed ratio.

The facility used for the etching is a magnetron reactive ion etching (RIE) mode dry etcher.

Etching conditions are: $Cl_2$ gas flow 20 SCCM, gas pressure 1 Pa. Wafer temperature during etching is below 20° C. because its back surface is cooled with He.

FIG. 10 exhibits a trend that Pt etching speed is increased from 10 nm/min. to 100 nm/min. when RF power is raised from 200 W to 600 W.

Pt/resist etching speed ratio, when RF power is raised from 200 W to 600 W, also shows an upward trend from 0.2 to 0.3; however, the etching speed ratio remains very low. The above quoted papers also report similar results in the dependence of Pt etching speed to RF power when $Cl_2$ gas is used.

In addition, the above cited papers describe the case where HBr gas was used as etching gas; in which case, according to the papers, Pt etching speed was reported to be 120 nm/min.

In such conventional cases where single substance gas such as $Cl_2$ or HBr is used as etching gas, Pt etching speed is very low; which means it takes a very long time to etch Pt of a required thickness (several hundreds nm). Therefore, a drawback of this method is deteriorated throughput of production facilities.

Furthermore, the prolonged etching time may cause a problem of etched resist layer during etching time. If the resist layer is made thicker, it affects the grade of definition, making formation of a fine pattern very difficult.

A possibility for increasing Pt/resist etching speed ratio is to add a gas containing carbon component and to conduct etching by means of plasma polymerization while piling up the carbon layer. This procedure, however, causes piling up of the carbon layer within the reaction chamber, which becomes a source of particle generation. This necessitates frequent maintenance servicing of facilities, making operation efficiency poor.

SUMMARY OF THE INVENTION

The objective of this invention is to offer a new manufacturing method of semiconductor devices, wherein Pt etching speed is increased, hence, throughput of production facilities can be improved.

In order to implement the objective, this invention features a semiconductor device manufacturing method, wherein an insulation layer, a bottom electrode Pt layer, a dielectric film and a top electrode Pt layer are provided on top of a substrate having already-completed circuit elements and wiring, and then, a capacitor is formed by selectively dry etching the bottom electrode Pt layer after selectively dry etching the top electrode Pt layer and the dielectric film.

The manufacturing method comprises a process to dry etch the Pt layer consisting of a bottom electrode or top electrode, wherein, either the Pt layer is dry etched while a compound of Pt and S is being composed, or a Pt and S compound is made first and then the Pt compound is dry etched. The manufacturing method uses a gas containing an S component as etching gas for Pt etching, or an etching gas containing S component as an additive gas; and also it implants S into the Pt layer, before the Pt dry etching process, by means of ion implantation to compose a S and Pt compound, and then dry etches the Pt compound thus composed.

Therefore, according to this invention, a Pt and S compound is composed during etching. Because the boiling point of this compound is far lower than that of Pt, the etching speed for the Pt layer can be increased to the improved throughput of manufacturing facilities, Pt etching time can be shortened, and resist etching prevented.

DESCRIPTION OF PREFERRED EMBODIMENTS

Turning now to the drawings, an explanation of the invention will be given with reference to the figures; where, the same parts as the conventional structure in FIG. 9 are given the same numerals.

In FIGS. 1(A)–(D), 1 denotes a Pt layer for a top electrode, 1a a top electrode, 2 a dielectric film, 2a a capacitance insulation film, 3 a Pt layer for the bottom electrode, 4 an insulation underlayer, and 5 and 6 are resists. For the sake of simplification, regions of circuit elements on the substrate do not appear in the drawings.

Figure 1A:
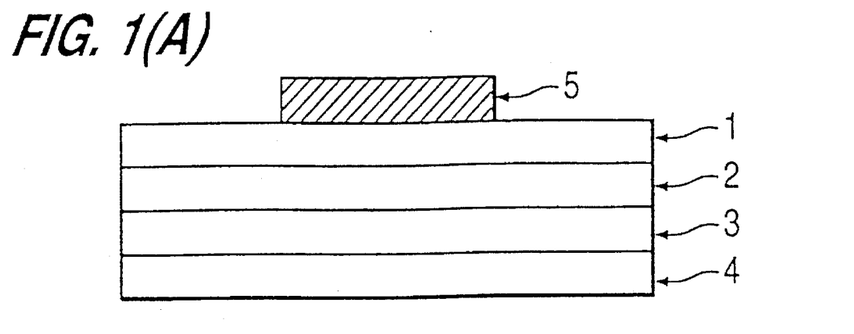
FIGS. 1(A)–(D) illustrate formation of a capacitor in an embodiment of this invention.

On the underlayer 4 provided over a silicon semiconductor substrate, is formed the 200 nm thick Pt layer 3 for the bottom electrode; on the Pt layer 3 for the bottom electrode is formed the 180 nm thick dielectric film 2; on the dielectric film 2 is formed the 200 nm thick Pt layer 1 for the top electrode.

Figure 1B:
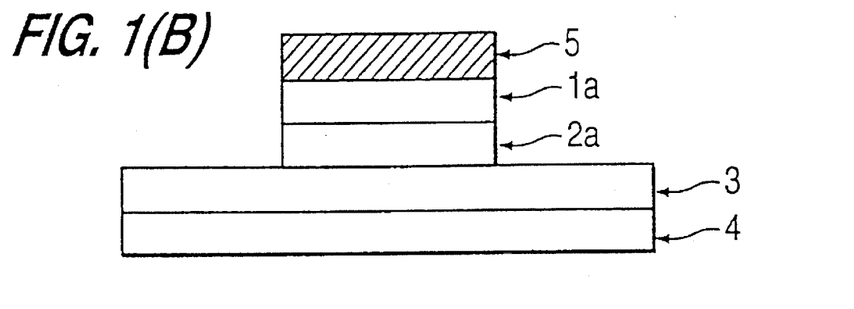
Figure 1C:
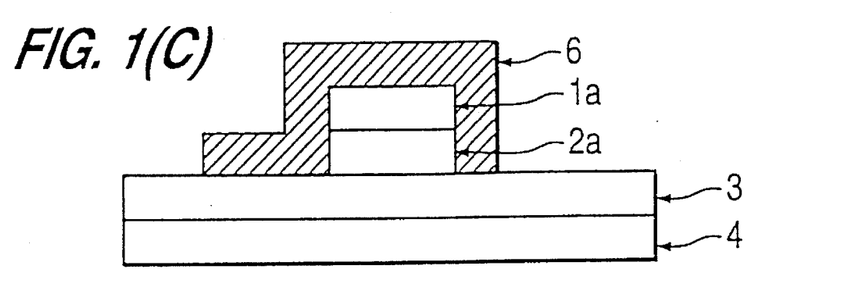
Figure 1D:
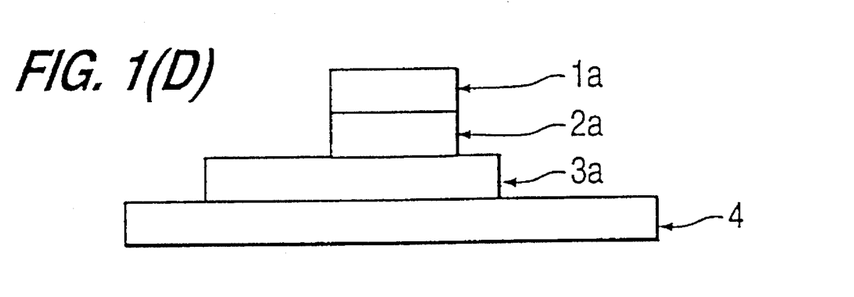

In order to form a capacitor out of the multi-layered structure thus fabricated. First, place the resist 5 on Pt layer 1 for the top electrode, for the purpose of making the top electrode 1a and the capacitance insulation layer 2a, as shown in FIG. 1(A). Next, as shown in FIG. 1(B), etch down the Pt layer 1 for top electrode and the dielectric film 2 to form the top electrode 1a and the capacitance insulation layer 2a; and stop etching when the surface of the Pt layer 3 for the bottom electrode is exposed. Then, place the resist 6 to entirely cover the top electrode 1a and the capacitance insulation layer 2a, as shown in FIG. 1(C). Finally, etch down the Pt layer 3 for the bottom electrode to form the bottom electrode 3a, as shown in FIG. 1 (D).

Figure 2:
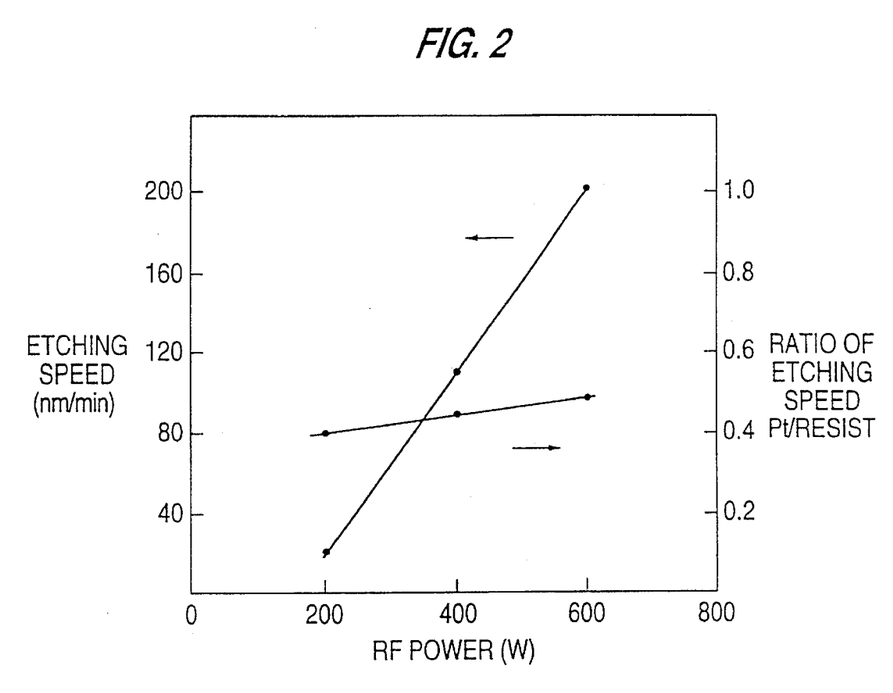
FIG. 2 is a characteristics chart that shows the dependence of Pt etching speed and Pt/resist etching speed ratio to RF power in Embodiment 1 of this invention, with $S_2Cl_2$ gas as etching gas.

In preferred embodiment 1 in order to manufacture a capacitor of above mentioned structure, $S_2Cl_2$ gas is used as the Pt etching gas. FIG. 2 shows Pt etching speed and Pt/resist etching speed ratio under a changing RF power in this embodiment of the invention.

A comparison between FIG. 2, characteristics of in this embodiment, and FIG. 10, those in a conventional manufacturing method, clarifies that Pt etching speed in this embodiment is twice as high, and Pt/resist etching speed ratio rises from 0.4 to 0.5 along with the increased RF power from 200 W to 600 W. Furthermore, Pt/resist etching speed ratio has been almost doubled.

Figure 3:
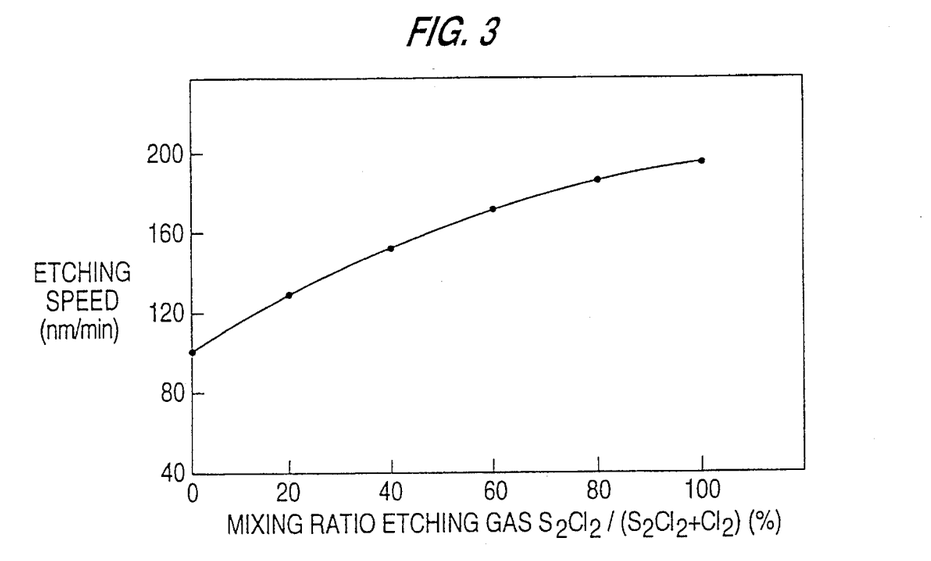
FIG. 3 is a characteristics chart that shows dependence of Pt etching speed to mixing ratio of etching gas between $Cl_2$ gas and $S_2Cl_2$ gas in Embodiment 2 of this invention.

FIG. 3 shows, as embodiment 2, the dependence of Pt etching speed to mixing ratio of etching gas when $Cl_2$ gas and $S_2Cl_2$ gas are mixed and used as etching gas. The horizontal axis denotes gas mixing ratio and the vertical axis Pt etching speed.

The facility used for etching is a magnetron RIE mode dry etcher. The etching conditions are: mixing ratio of $S_2Cl_2/(S_2Cl_{2+Cl2})$ etching gas is varied, RF power 600 W, and gas pressure 1 Pa. The wafer temperature during etching is maintained below 20° C. by means of wafer back surface cooling.

FIG. 3 shows that Pt etching speed follows the upward trend from 100 nm/min. to 200 nm/min. when the mixing ratio of etching gas is changed from 100% $Cl_2$ gas to 100% $S_2Cl_2$ gas.

According to this embodiment, Pt etching speed can be increased by the use of an etching gas containing an S component, the throughput of production facilities can be raised, and the Pt/resist etching speed ratio can be made higher.

In this embodiment, use of sulfur chloride gas such as $S_2Cl_2$ gas or use of $Cl_2$ and $S_2Cl_2$ mixed gas are used as examples as the etching gas. However, as the gas containing S component, sulfur fluoride gas such as $SF_6$ gas or $S_2F_2$ gas may be used to obtain the same results.

Figure 4:
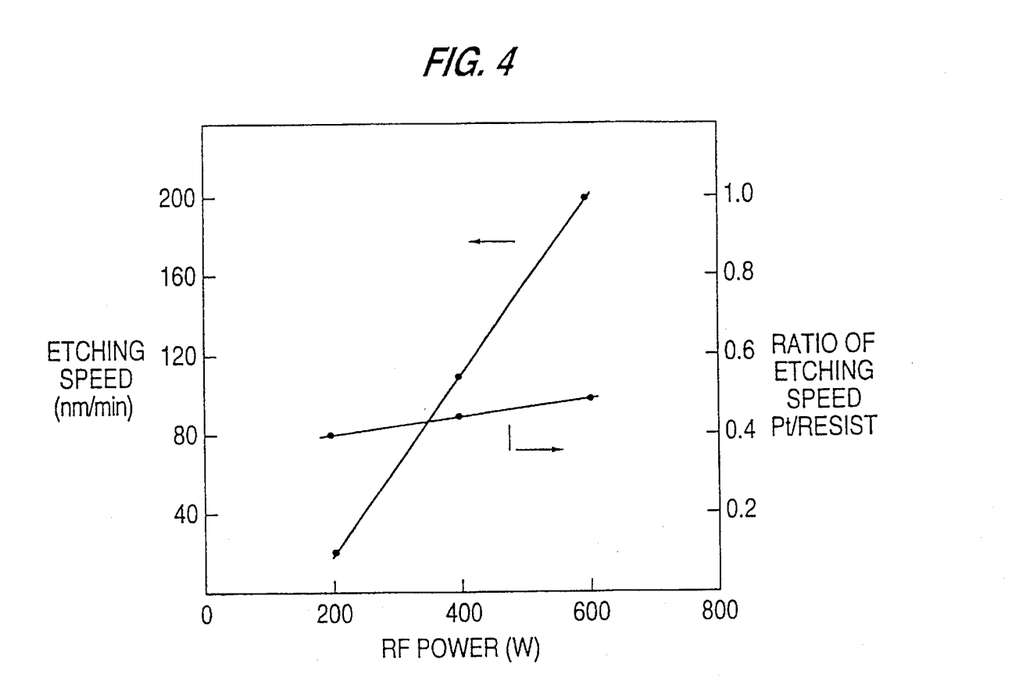
FIG. 4 is a characteristics chart that shows the dependence of Pt etching speed and Pt/resist etching speed ratio to RF power in Embodiment 3 of this invention; where, the etching gas is HBr gas and the additive gas is $H_2S$ gas.

As embodiment 3, $H_2S$ gas is added to the etching gas in the Pt etching process. FIG. 4 shows the dependence of Pt etching speed and Pt/resist etching speed ratio to RF power when HBr gas is used as the etching gas, and $H_2S$ gas as an additive gas. The horizontal axis denotes RF power, the left vertical axis Pt etching speed, and the right vertical axis Pt/resist etching speed ratio.

The facilities used for etching is a magnetron RIE mode dry etcher. The etching conditions are: HBr gas flow 20 SCCM, $H_2S$ gas flow 10 SCCM, and gas pressure 1 Pa. The wafer temperature during etching is maintained below 20° C. by means of wafer back surface cooling.

FIG. 4 shows that Pt etching speed follows the upward trend from 20 nm/min. to 200 nm/min. when FR power is increased from 200 W to 600 W; as compared with the conventional case shown in FIG. 10. Pt etching speed is almost doubled. The Pt/resist etching speed ratio follows the upward trend from 0.4 to 0.5 as RF power increases from 200 W to 600 W. As compared with the case when $Cl_2$ gas was used as Pt etching gas, the etching speed ratio with resist is almost doubled.

Figure 5:
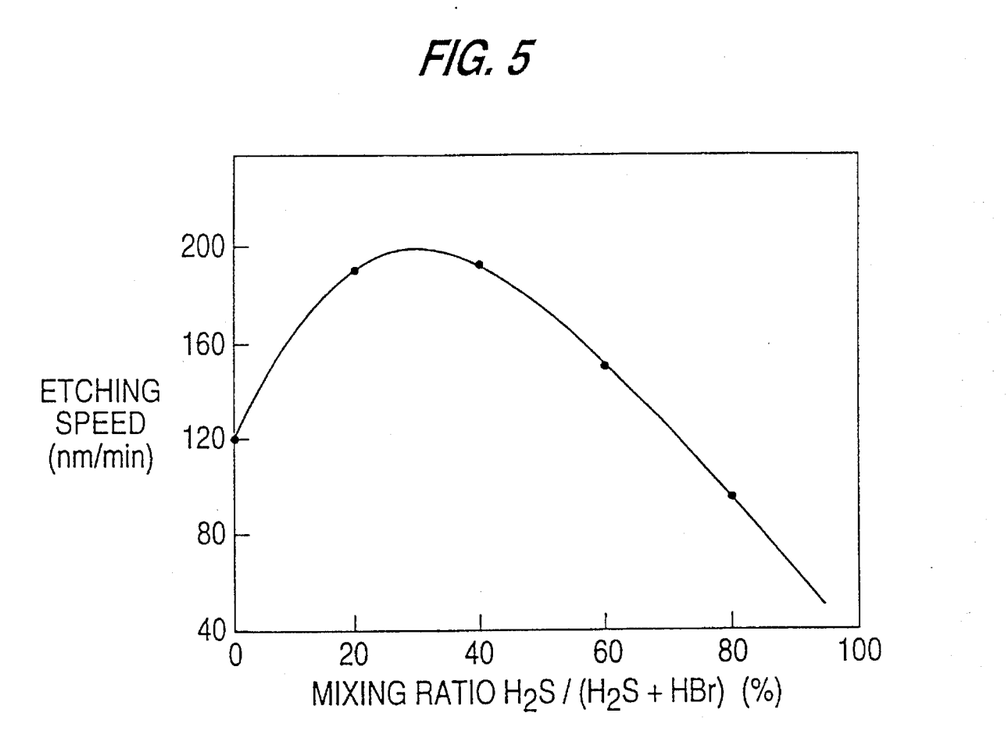
FIG. 5 is a characteristics chart that shows the dependence of Pt etching speed to mixing ratio between HBr gas and $H_2S$ gas, in Embodiment 3 of this invention.

FIG. 5 shows the dependence of Pt etching speed on the mixing ratio of gas when HBr gas is used as the etching gas and $H_2S$ gas as the additive gas. The horizontal axis denotes a gas mixing ratio and the vertical axis Pt etching speed.

The facility used for etching is a magnetron RIE mode dry etcher. The etching conditions are $H_2S/(H_2S+HBr)$ mixing ratio is varied. RF power 600 W, and gas pressure 1 Pa. The wafer temperature during etching is maintained below 20° C. by means of wafer back surface cooling.

FIG. 5 shows that Pt etching speed reaches the fastest, 200 nm/min., when the gas mixture ratio is around 30%.

According to this embodiment, Pt etching speed can be increased by the use of a gas containing a S component as the additive gas, the throughput of production facilities can be raised, and the Pt/resist etching speed ratio can be made high.

In this embodiment, $H_2S$ gas as the additive gas was used as an example. However, as the gas containing S component, $SO_2$ gas may be used to obtain the same results.

Next, as embodiment 4 of this invention, S is implanted into Pt by means of ion implantation to compose a S and Pt compound; and then Pt is dry etched. FIGS. 6(A)–(D) illustrate formation of a capacitor according to the fourth embodiment; where, 1 is the Pt layer for the top electrode, 1a the top electrode, 2 the dielectric film, 3 the Pt layer for the bottom electrode, 4 the underlayer made of insulation layer, and 5 the resist.

Figure 6A:
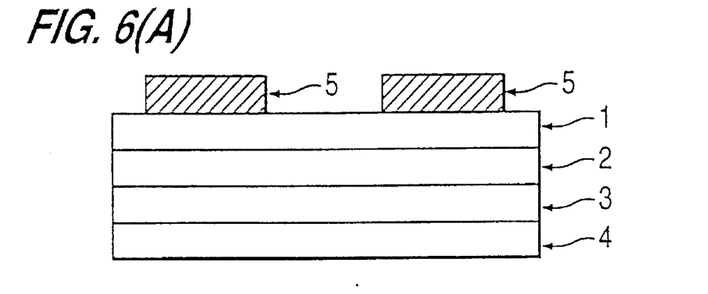
FIGS. 6(A)–(D) illustrate formation of a capacitor in Embodiment 4 of this invention.

On the underlayer 4, provided over a silicon semiconductor substrate, is formed a 200 nm thick Pt layer 3 for the bottom electrode; on the Pt layer 3 for the bottom electrode is formed a 180 nm thick dielectric film 2; on the dielectric film 2 is formed a 200 nm thick Pt layer 1 for top electrode. The process used to form a capacitor out of the multi-layered structure thus fabricated will be described below.

Figure 6B:
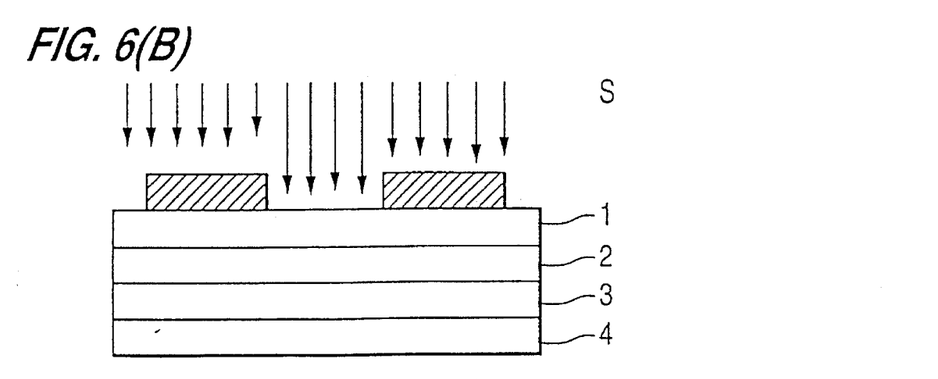
Figure 6C:
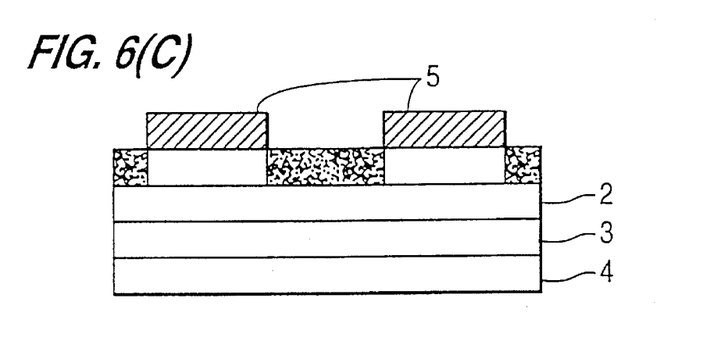
Figure 6D:
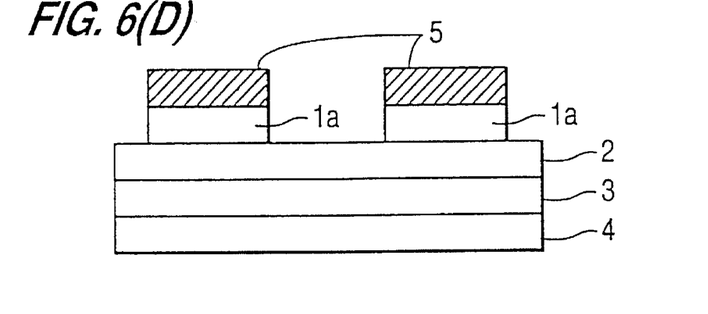

First, place the resist 5 on the Pt layer 1 for the top electrode, as shown in FIG. 6(A). Next, as shown in FIG. 6(B), implant S ions into Pt layer 1 for the top electrode by means of ion implantation to compose a compound of Pt and S in the region to be etched, as shown in FIG. 6(C). In this stage, S is not implanted into the dielectric film 2. Then, as FIG. 6(D) illustrates, etch the Pt and S compound.

Figure 7:
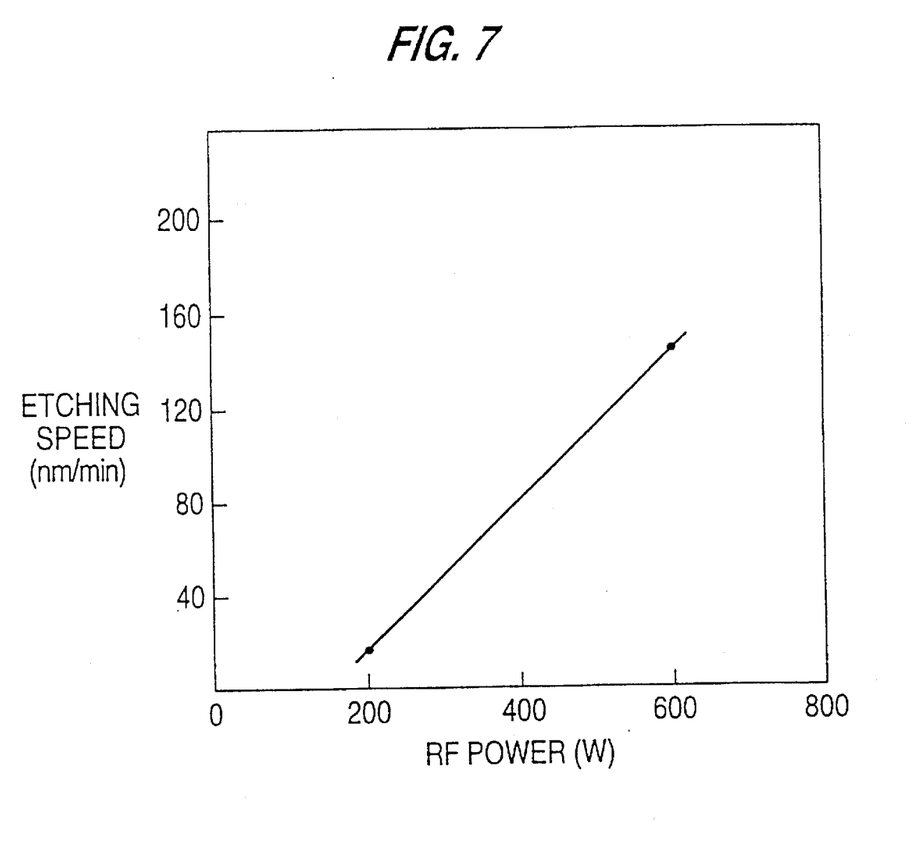
FIG. 7 is a characteristics chart that shows the dependence of Pt etching speed to RF power in Embodiment 4; where, S was implanted into Pt by means of ion implantation to compose a S and Pt compound, and then Pt is etched with $Cl_2$ gas.

FIG. 7 shows the dependence of Pt etching speed to RF power, wherein, S is implanted into Pt by means of ion implantation to compose S and Pt compound, and then $Cl_2$ gas is used as etching gas. The horizontal axis denotes RF power and the vertical axis Pt etching speed.

The facilities used for etching is a magnetron RIE mode dry etcher. The ion implantation conditions are: acceleration voltage 600 KeV and dope quantity $5 \times 10^{15}$ atm/cm². The etching conditions are: $Cl_2$ gas flow 20 SCCM, and gas pressure 1 Pa. The wafer temperature during etching is maintained below 20° C. by means of wafer back surface cooling.

FIG. 7 shows that Pt etching speed follows an upward trend from 15 nm/min. to 150 nm/min. when RF power is raised from 200 W to 600 W.

As compared with FIG. 10, the conventional case, Pt etching speed is about 1.5 times as high using the embodiment of FIG. 6.

According to this embodiment, the etching speed of the Pt layer 1 for the top electrode can be increased by first implanting S into the Pt layer 1 for the top electrode by means of ion implantation to compose a S and Pt compound, and then dry etching the compound. By so doing, the throughput of production facilities can be improved.

The mechanism for increasing Pt etching speed will be explained with reference to FIG. 8, regarding a case where a gas containing S component is used as the etching gas and a gas containing S component is used as the additive gas, and another case, where Pt is dry etched while the Pt and S compound is being composed, or Pt and S compound is first composed and then Pt is dry etched.

Figure 8:
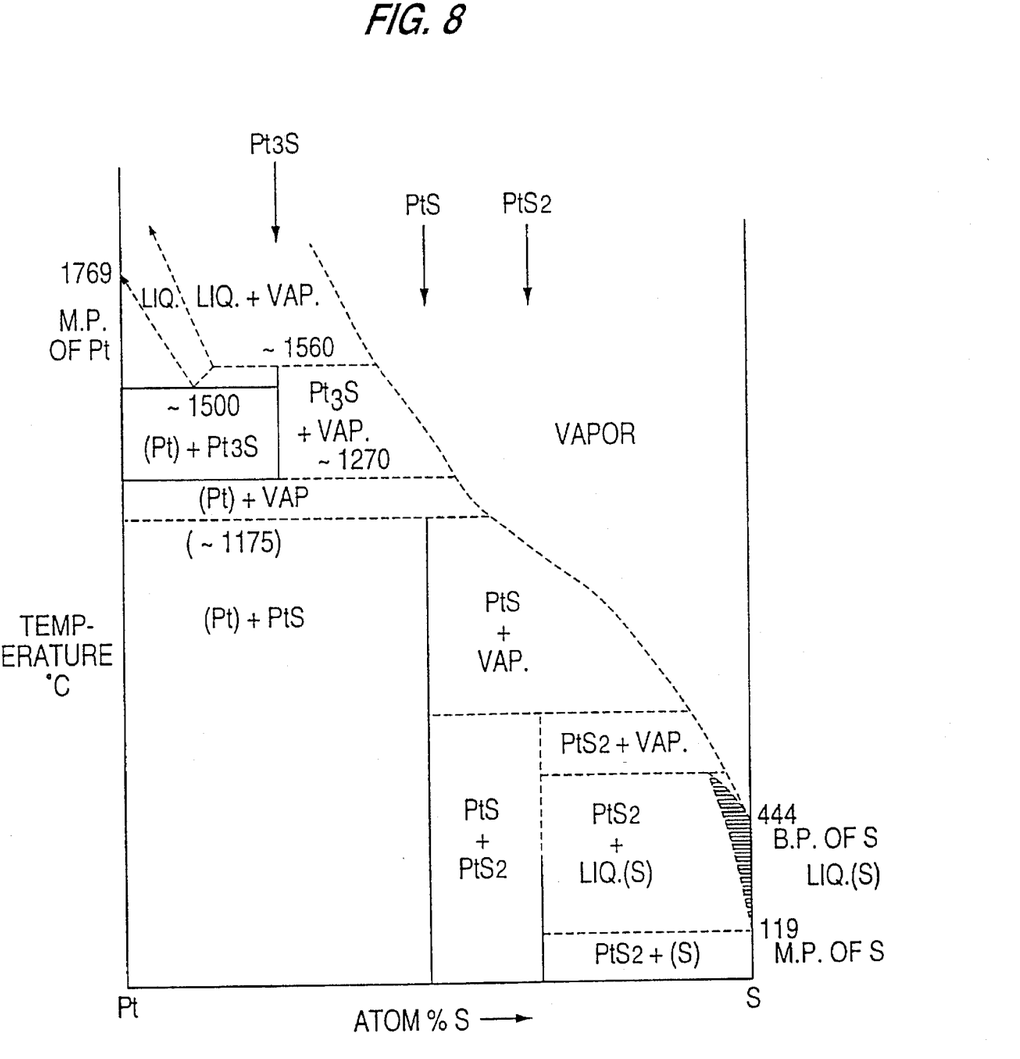
FIG. 8 is a Pt/S alloy phase diagram.

FIG. 8 is Pt/S alloy phase diagram, that illustrates that by mixing a very small quantity of S into Pt, it starts evaporating at 1175° C. It is known that the boiling point of Pt is as high as 3804° C. However, as mentioned above, the boiling point of Pt is lowered by mixing a very small quantity of S into Pt.

$S_2Cl_2$ gas and $S_2F_2$ gas, both are S-containing gas, have large S/X ratio (X=Cl, F) and S is easily deposited when dissociated in plasma.

Therefore, when S-containing gas is used as etching gas and S-containing gas is used as additive gas, the S component dissociated in plasma reacts with Pt to compose a low boiling point compound. Because of this, Pt etching speed is increased as compared with the case when $Cl_2$ gas is used as the etching gas.

So, in the process where the Pt layer 1 for the top electrode and the dielectric film 2 are to be etched, conduct etching under relatively slow Pt etching conditions, and stop it as soon as the Pt layer 3 for the bottom electrode is exposed. In the next process where the Pt layer 3 for the bottom electrode is to be etched, conduct etching under fast Pt etching conditions. In this way, required the capacitor structure may be formed.

As the above mentioned embodiments illustrate, the process according to this invention uses a S-containing gas as Pt etching gas, or a gas containing an S component as the additive gas to change Pt for the electrode into a low boiling point S/Pt compound; and conducts etching after compound is composed; therefore, Pt etching speed can be increased. Furthermore, etching speed ratio with respect to resist can also be increased.

This invention, therefore, implements new manufacturing method of semiconductor devices which provides high processing accuracy and high throughput of production facilities.

Of course, it should be understood, that a wide range of changes and modifications can be made to the preferred embodiments described above. It is therefore intended that the foregoing detailed description be regarded as illustrative rather than limiting and that it be understood that it is the foregoing claims, including all equivalents, which are intended to define the scope of this invention.

What is claimed is:

1. A semiconductor device manufacturing method, wherein a capacitance element is formed by:

providing, on top of a substrate having already-completed circuit element and wiring, an insulation layer, a bottom electrode Pt layer, a dielectric film and a top electrode Pt layer;

selectively dry etching said top electrode Pt layer and said dielectric film; thereafter selectively dry etching said bottom electrode Pt layer; and before conducting dry etching on said Pt consisting bottom electrode or top electrode, implanting S ions into said Pt layer by means of ion implantation to compose S and Pt compound, and then dry etching the S/Pt compound thus composed.

* * * * *

UNITED STATES PATENT AND TRADEMARK OFFICE
CERTIFICATE OF CORRECTION

PATENT NO. : 5,500,386
DATED : March 19, 1996
INVENTORS : Matsumoto et al.

It is certified that error appears in the above-identified patent and that said Letter Patent is hereby corrected as shown below:

Column 4, lines 27 and 28, change "$S_2Cl_2/(S_2Cl_2+Cl_2)$" to --$S_2Cl_2/(S_2Cl_2+Cl_2)$--.

Column 4, line 58, change "C." to --C--.

Column 5, line 9, change "C." to --C--.

Signed and Sealed this

Thirtieth Day of May, 2000

Q. TODD DICKINSON

*Attest:*

*Attesting Officer*            *Director of Patents and Trademarks*